United States Patent [19]
Ehnholm et al.

[11] Patent Number: 5,882,304
[45] Date of Patent: Mar. 16, 1999

[54] METHOD AND APPARATUS FOR DETERMINING PROBE LOCATION

[75] Inventors: Gösta J. Ehnholm; Erkki T. Vahala, both of Helsinki, Finland

[73] Assignee: Picker Nordstar Corporation, Finland

[21] Appl. No.: 958,309

[22] Filed: Oct. 27, 1997

[51] Int. Cl.$^6$ .................................................. A61B 5/055

[52] U.S. Cl. ...................... 600/411; 600/420; 600/424; 324/316; 324/318; 324/322

[58] Field of Search .................................. 324/316, 318, 324/322; 600/411, 420, 424

[56] References Cited

U.S. PATENT DOCUMENTS

| 4,572,198 | 2/1986 | Codrington | 600/424 |
| 5,218,964 | 6/1993 | Sepponen | 600/420 |
| 5,488,950 | 2/1996 | Ehnholm . | |

OTHER PUBLICATIONS

E. Dormann, et al.; "Application of The Organic Conductor (Fluoranthene)$\overset{+}{2}$+PF $\overline{6}$ As An ESR Magnetic Field Probe"; Journal of Magnetism and Magnetic Materials 54–57 (1986) 1315–1316.

D. Duret, et al.; "A New Ultra Low–Field ESR Spectrometer"; Rev. Sci. Instrum., vol. 62, No. 3, Mar. 1991, pp. 685–694.

*Primary Examiner*—Ruth S. Smith
*Attorney, Agent, or Firm*—Timothy B. Gurin; John J. Fry; Eugene E. Clair

[57] ABSTRACT

A magnetic probe (1) for use with a magnetic resonance imaging apparatus comprises an electron spin resonance (ESR) magnetometer. The position of the probe (1) tracked by measuring the resonant frequency of an ESR sample (32) in the probe. The resonant frequency is measured in the presence of a gradient sequence which employs three orthogonal, linear gradients. By determining the resonant frequency of the ESR sample in the presence of each of the gradients, the position of the probe can be determined. The probe may be placed on or in an object, and the position of the probe may be displayed on a desired magnetic resonance image of the object.

27 Claims, 4 Drawing Sheets

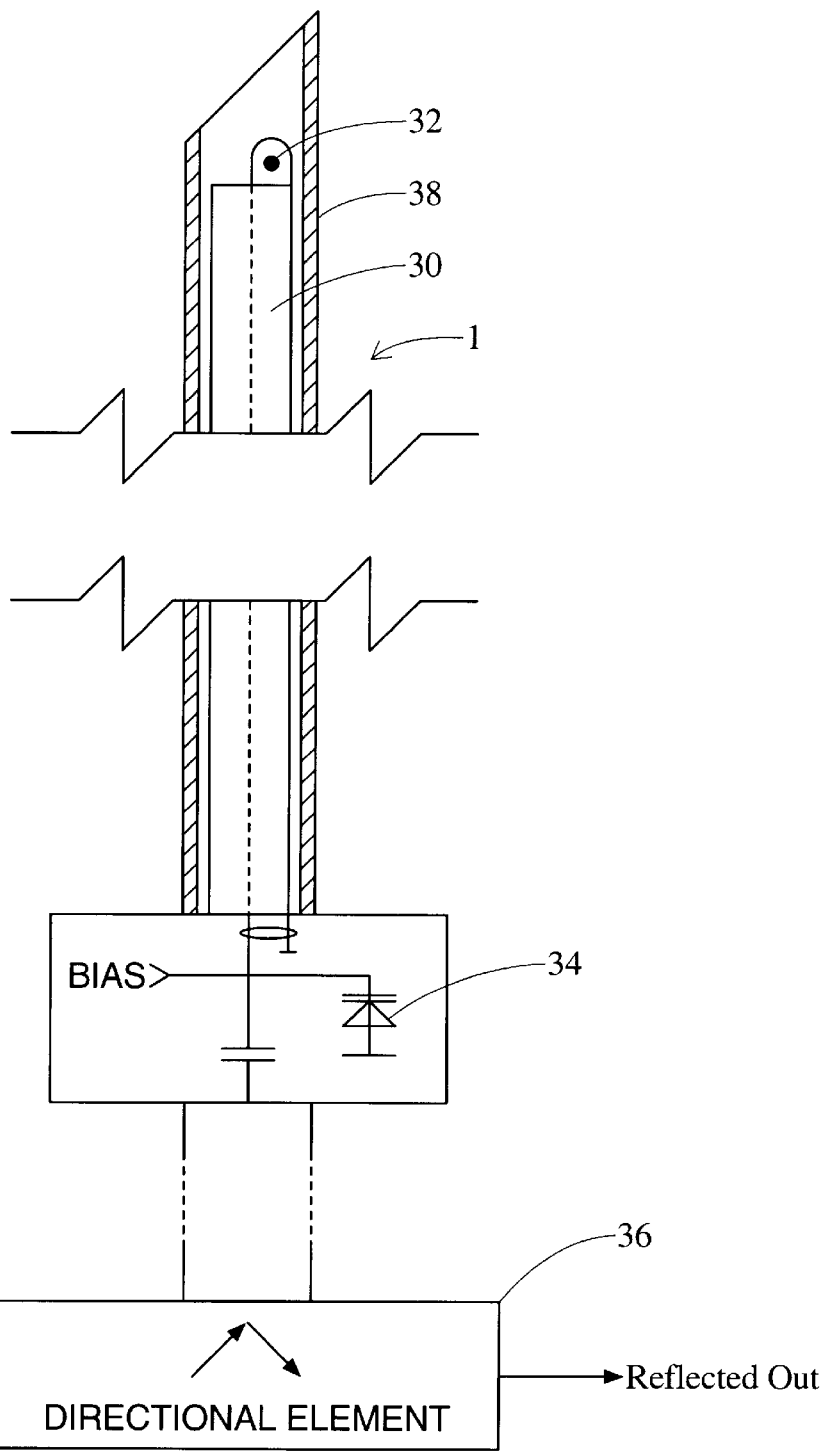

METHOD AND APPARATUS FOR DETERMINING PROBE LOCATION

BACKGROUND

This invention relates to imaging systems using magnetic resonance, and more specifically to methods and apparatus for determining the location of a probe within the anatomy of a patient.

Magnetic Resonance Imaging (MRI) is commonly used for diagnostic purposes. It can also be employed for other purposes, such as therapy and image-guided surgery, which is becoming more frequent. In image guided surgery, MRI is used to make an image, and the position of a surgical instrument is determined in relation to the anatomy and to the images of the patient. Other modalities have also been used, especially x-ray computer tomography (CT). For more details, see "Image-guided Access Enhances Microtherapy", in Supplement to Diagnostic Imaging November 1996.

Positioning of surgical instruments, such as catheters and biopsy needles, on the image should be made quickly and with high precision to facilitate the work of the surgeon. In some image guided surgery systems, the position of the surgical instrument is determined using information of a non-magnetic character, for example by using an optical or ultrasonic localizer. Other systems use magnetic resonance signals. The advantage of the optical method is that it is fast, allowing tracking of the instrument in real time. A disadvantage is that it needs its own optical reference frame, which has to be registered or correlated in relation to the patient and the images. The instrument also has to be in optical contact with the localizer.

An advantage of using MR signals for positioning of the surgical instrument is that spatial information may be derived from the field of the MRI gradient coils, which is also used to determine the position of the anatomical details seen in the image. This fact makes it easier to ensure that the position of the instrument is seen in the correct place in the image.

Localization using magnetic resonance methods can be passive or active. Passive methods use the normal MR image, where the instrument is made visible by attaching markers to it. Markers are formed either by choosing suitable materials for the instruments themselves, or by attaching relatively contrasty markers to the instruments such that the markers appear on the image either as a clear or a dark spot or region. Active tracking uses a small NMR coil acting on a proton sample. The signal generated thereby is amplified in a separate channel and added to the image. In this way it can be made stronger to obtain a more clear spot.

Yet another method is to use dynamic polarization to amplify the NMR signal emanating from a reference marker attached to the region of interest, for example as disclosed in U.S. Pat. No. 5,218,964 to Sepponen. With this method the same receiver coils and processing can be used as for the image.

A drawback to the passive methods is one of visibility. The marker signal has a limited strength and is prone to different types of artefacts. In certain circumstances the position of the instrument may become lost or uncertain. The active markers have the problem of complexity, which tends to make position tracking slow and/or less reliable, and often they tend to have too large a size.

As will be appreciated, a method and apparatus which provides a more accurate, yet compact and straightforward method of determining the location of a surgical instrument with respect to the anatomy is needed.

SUMMARY

The present invention addresses these matters, and others.

According to a first aspect of the invention, a method of determining a position of a surgical instrument placed within the imaging region of a magnetic resonance apparatus is provided. The method includes the steps of placing an electron spin resonance sample in a known position with respect to the surgical instrument, placing the sample in the imaging region, applying at least a first gradient magnetic field in the imaging region, determining the resonant frequency of the sample in the presence of the at least a first gradient field, and based on the resonant frequency of the sample, determining the position of the surgical instrument with respect to the at least a first gradient field.

According to a more limited aspect, the method includes the steps of applying a second gradient field in the imaging region, determining the resonant frequency of the sample in the presence-of the second gradient field, applying a third gradient field in the imaging region, determining the resonant frequency of the sample in the presence of the third gradient field, and based on the resonant frequency of the sample, determining the position of the surgical instrument with respect to the first, second, and third gradient fields. The first, second an third gradient fields may be mutually orthogonal.

According to another limited aspect of the invention, the method includes the steps of removing the sample from the instrument and placing a surgical instrument or device in a known position with respect to the first instrument.

According to another more limited aspect of the invention, the step of determining the resonant frequency of the sample comprises the step of locking the resonant frequency of an oscillator to the resonant frequency of the sample. The gradient field may be a bipolar gradient field and the resonant frequency data collected during the negative gradient portion is subtracted from data collected during the corresponding positive gradient portion. The method may also include the step of determining the orientation of the probe.

According to yet another more limited aspect of the invention, a magnetic resonance image of an object in the imaging region is obtained, and the position of the surgical instrument is displayed in relation to the image of the object.

According to another aspect of the invention, a magnetic resonance apparatus comprises means for producing a homogeneous magnetic field in an imaging region, a probe containing an electron spin resonance sample, means for producing gradient magnetic fields in the imaging region, and means for determining the electron spin resonance frequency of the sample in the presence of at least one magnetic field gradient, whereby the position of the probe may be determined in relation to the at least one magnetic field gradient.

According to a more limited aspect, the apparatus comprises means for producing three mutually orthogonal, linear magnetic field gradients. The gradients are produced sequentially, and the electron spin resonance frequency is determined in the presence of each of the three magnetic field gradients.

According to another more limited aspect of the invention, the means for determining comprises an oscillator whose frequency is locked to the resonant frequency of the sample. According to a still more limited aspect of the invention, the apparatus comprises a modulator which modulates the signal applied to the probe and a demodulator which demodulates the output of the probe.

According to yet another more limited aspect of the invention, the probe comprises a length of coaxial cable having an inner and outer conductor connected together at one end of the loop, and the sample is placed in the loop.

According to another aspect of the invention, a device for determining a position of an instrument within the imaging region of a magnetic resonance imaging apparatus having a homogeneous magnetic field and capable of generating three orthogonal time varying gradient magnetic fields is provided. The device comprises a probe which can be placed in a known position in relation to the instrument and means for determining the resonant frequency of the sample in the presence of the gradient fields, whereby the position of the instrument may be determined.

According to a more limited aspect of the invention, the device comprises a generally tubular needle having an inner diameter such that the probe may be inserted within the needle.

According to another more limited aspect of the invention, the probe comprises a length of coaxial cable having an inner and an outer conductor connected together at one end of the cable, the sample being placed near the interconnection. According to a still more limited aspect of the invention, the sample is attached to the dielectric material of the coaxial cable.

A first advantage of the present invention is that a new and improved method of tracking medical instruments is provided.

Another advantage is that the invention provides a strong tracking signal while avoiding image artifacts prevalent in prior art devices. In fact, the signal is even stronger than active devices employing dedicated proton resonance coils.

Still another advantage is that the present invention it is fast and facilitates the making of a compact, simple, and automatic tracking device.

Yet another advantage is that the present invention operates in conjunction withe the gradient magnetic fields present in a conventional MRI apparatus.

DESCRIPTION OF THE DRAWINGS

FIG. 4 is an ESR probe according to the present invention.

DESCRIPTION OF THE INVENTION

Figure 1:
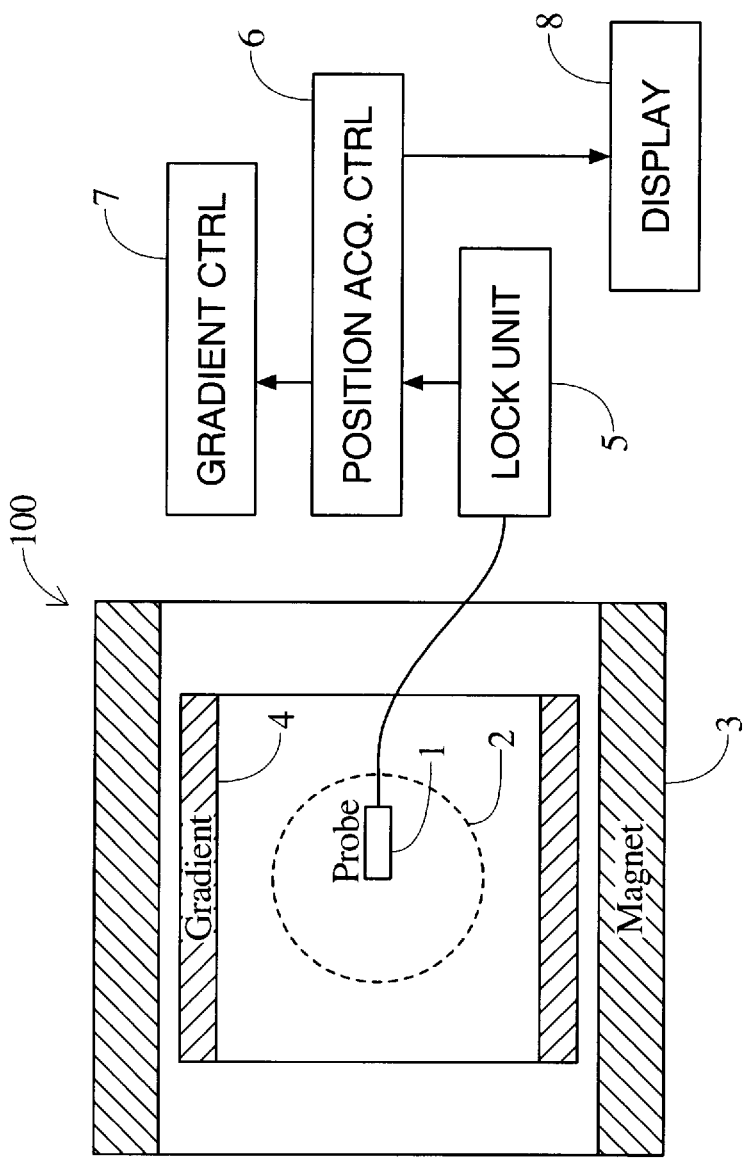
FIG. 1 is a block diagram of a system according to the present invention.

The present invention relates to the use of electron spin resonance (ESR) for detecting magnetic field strength. ESR is based on using paramagnetic electrons, present in certain substances, which resonate in a magnetic field with a frequency proportional to the field strength. The resonance frequency is much higher, by approximately a factor of 658, than for protons resonating in the same field. Thus, for typical fields of interest with strengths between 0.01–0.3 Tesla the frequency is approximately in the range of 0.3–8 GHz.

The ESR phenomenon manifests itself by a strong relative increase in the real and imaginary parts of the complex susceptibility of the ESR substance at and around the resonant frequency. The width of this frequency band is termed the ESR linewidth (LW) and for precise determination of the magnetic field strength one needs a narrow linewidth. For a typical sample, which could be of the order of 3 mm across, one requires that the LW be approximately equal to or less than the frequency spread caused by typical system field gradients acting on the sample. In practical terms the LW, in field units, should be less than 100 micro Tesla, and preferably less than 10 micro Tesla. A suitable substance is TCNQ (N-methyl-pyridinium), which in addition to a narrow LW has other desirable properties: It is relatively inexpensive, it is chemically stable, and it is a solid.

It also has a resonance frequency which is relatively independent of temperature. Measurement has shown that it shifts less than 0.2 parts per million (ppm) for a 1 degree K change in temperature. Other suitable substances are known in the art, such as the organometals described by E. Dormann et. al. in J. of Magnetism and Magnetic Materials 54–57 (1986) 1315–1316, which have even narrower LW's. Suitable substances are also described in A New Ultra Low-Field ESR Spectrometer, Rev. Sci. Instrum. 62(3), March 1991 by D. Duret, et al.

The ESR resonance frequency is normally detected by coupling the sample to the magnetic field of a resonator and measuring its effect on either the Q-value or the center frequency of the resonator. This can be accomplished in several ways. One method is to amplify the resonator signal, then limit its amplitude and coupling back the limited signal so as to make the system into an oscillator. The signal strength before the limiter then gives a measure of the Q-value, and the signal frequency is pulled towards the ESR-frequency. This method can be developed to yield the desired information.

A preferred method is to feed an oscillating signal to the resonator and measure how it is either reflected from or transmitted via the same. Of these methods the latter one is usually less sensitive to coupling parameters. Thus the incoming signal line couples weakly to the resonator, as does the outgoing one, but the direct coupling between the two is made so small as to become insignificant compared to the one mediated via the resonance.

The present invention determines the space coordinates of an electron spin resonance (ESR) magnetometer, henceforth called the ESR-probe. Tracking of the probe is done by measuring the ESR frequency of a sample in the probe. The ESR frequency is proportional to the magnetic field strength acting on the probe, thus the field can be indirectly measured. The measurement is done several times with different known timevarying magnetic field strength gradients acting on the probe. The accumulated field strength data can be used to calculate the magnetometer position, and the result can be displayed on a magnetic resonance image, prepared either previously or in conjunction with the tracking operation. The image can be prepared from a location and with directions facilitating the use of the position data, e.g. the image plane can be chosen to contain the probe.

There are several methods for monitoring the reflected or transmitted output signal and deducing the ESR frequency of the sample in the probe. One is to sweep the frequency of the incident signal while recording the output, which then after postprocessing shows the frequency at which the excited paramagnetic electrons affect it the most. In some cases it is expedient to tune the center frequency of the ESR resonator electronically, e.g. with a capacitance diode, to keep it continuously tracking that of the incident signal. This eliminates the influence of the resonator on the output, making it easier to detect said effect of the electrons.

With reference to FIG. 1, an MRI apparatus 100 includes a magnet 3 for generating a main magnetic field and gradient coils 4 which generate time-varying gradient magnetic fields, preferably in three orthogonal directions (e.g., x, y, z). Although an open magnet is shown, the present invention may also be used in connection with cylindrical or other magnet geometries. A patient or other object to be imaged is placed in the imaging region 2 of the imaging apparatus 100. As known in the art, the MRI apparatus 100 also includes an RF transmit and receive apparatus (not shown) for exciting magnetic resonance of materials within the imaging region and detecting the signals excited thereby. As is also conventional in the art, the MRI apparatus generates and displays images of the internal anatomy of a patient or other object in the imaging region.

In a preferred embodiment, the probe is tracked using a frequency locking technique in conjunction with the time varying gradients generated by the MRI apparatus 100. With further reference to FIG. 1, a lock unit 5 is connected to the probe 1 and position acquisition controller 6. The probe contains an active ESR sample, which exhibits resonance when in the magnetic field Bo produced by the magnet 3. The Bo-field is modified by switching on or off the gradient fields using the gradient coils 4. The lock unit 5 measures the ESR frequency of the sample in the probe 1, and thus also the local field acting on the probe 1. The result of the measurement is fed to the position acquisition controller 6, which also acts on the gradient coils 3 through a gradient controller 7. In a preferred embodiment, the gradient controller 7, the position acquisition controller 6 and the display 8 are components of an MRI scanner.

The position of the ESR probe 1 is determined using the three gradient fields produced by the MR apparatus 100. In the presence of one of the gradient magnetic fields the ESR frequency becomes a function of the position along that gradient. If the gradient magnetic field is linear in a particular direction, the ESR frequency is a linear function of the position of the probe 1 in the direction of the gradient. The probe 1 coordinate in the corresponding direction is thus obtained by measuring the frequency, and this can be repeated for all three directions to determine the position of the probe 1 in three dimensions. The position of the probe can displayed on a display unit 8 such as a CRT or other monitor, for example with the position of the probe displayed superimposed on a desired image of the subject.

Figure 2:
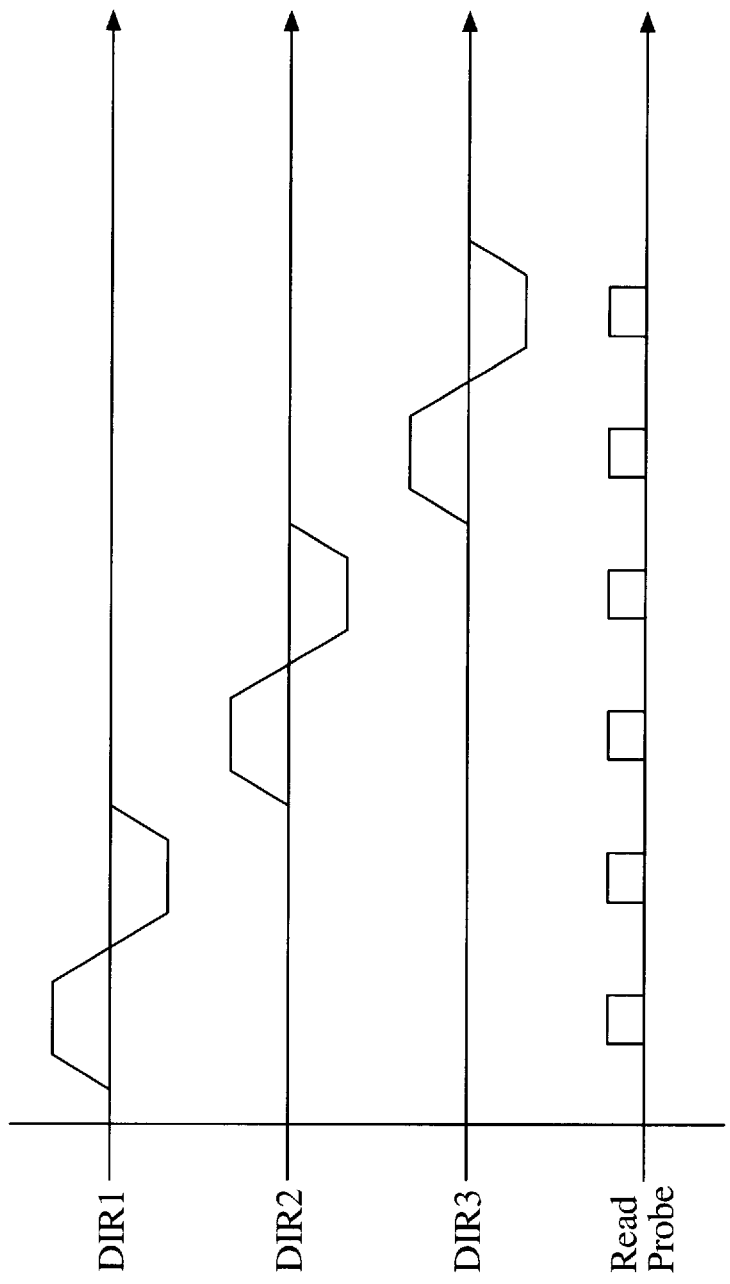
FIG. 2 depicts a gradient sequence according to the present invention.

FIG. 2 depicts a gradient sequence suitable for determining the position of the probe. The position acquire controller 6 causes the gradient controller 7 to generate three gradients, DIR1, DIR2, and DIR3 (e.g., x, y, z), in sequence. To compensate for a possible drift in Bo, bipolar gradients are used. ESR frequency data collected during a negative gradient is subtracted from data collected during the corresponding positive gradient. The difference signal thus formed depends only on the gradient with the Bo dependence eliminated. Those skilled in the art will recognize that gradient sequences other than that depicted in FIG. 2 may be used to determine the position of the probe 1 without departing from the spirit of the present invention.

Figure 3:
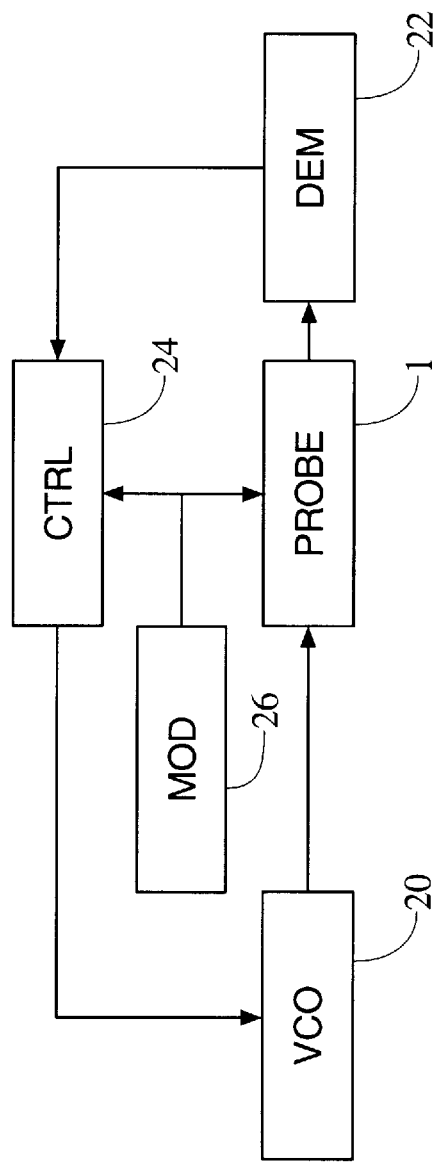
FIG. 3 is a block diagram of a lock unit according to the present invention.

The lock unit is shown in FIG. 3. The measuring circuit contains a voltage controlled oscillator (VCO) 20, whose output gives an exciting signal which is fed to a resonator which forms part of the probe 1. The resonator contains a small amount of a suitable substance such as TCNQ whose paramagnetic electrons will absorb signal if the frequency generated by the VCO 20 is equal to the ESR frequency of the resonator, thereby affecting the amplitude of the output signal of the resonator.

The output of the resonator is demodulated by a demodulator 22 such as a diode detector. The demodulator 22 output is further processed by a control unit 24 to form a control voltage, which is in turn coupled to the input of the VCO 20. The effect of the control voltage is to bring the VCO 20 frequency back to that of the ESR, thus locking the VCO to the ESR frequency. This method is explained in greater detail in U.S. Pat. No. 5,488,950 to Ehnholm, incorporated by reference herein. In a preferred embodiment, a modulator 26 modulates the magnetic field acting on the probe 1 using a field modulation technique. This modulation can be arranged using a separate coil, a field inducing integrated element in the probe 1 itself, or by a gradient coil. In the case of the gradient coil, modulation can be achieved by reversing the direction of the current in one of the gradient coil halves, which causes the gradient coil to resemble a normal Helmholtz-pair. The demodulator 22 recovers the amplitude change caused by the modulation. Alternative methods, such as frequency modulation of the VCO 20, may also be used.

Proper function of the ESR tracking presupposes that the frequencies of the VCO 20 and probe is frequency locked in the presence of the main magnetic field Bo. This lock can be broken, for instance if the probe is moved outside the homogeneous region of Bo, or by the strong gradients used for making the MR image. Automatic circuitry may thus be employed to perform fast relocking based on the principle of the field (or frequency) modulation used for the locking. When the VCO and ESR frequencies are locked, the amplitude of the ESR resonator output is modulated at the second harmonic of the modulating frequency. This is be detected using a phase locked detector. The reference signal for the phase locked detector is formed by generating the second harmonic from the field (or frequency) modulating signal. When the output voltage from the phase locked detector rises above a set threshold, the system is locked. If this is not the case the automatic relocking feature is activated. A saw-tooth wave is fed to the input of the VCO 20, whose output frequency thus sweeps through a certain search range. When the frequency coincides with the electron spin resonance the system returns to the locked mode. Alternate methods for implementing the search and relocking feature are known by those skilled in the art.

With reference to FIG. 4, the ESR resonator/probe 1 is formed by a piece of coaxial cable 30 which has a length approximately equal to an integral number of halfwavelengths in the cable at the ESR frequency. The ESR sample 32 is placed in a small loop formed by the inner conductor of the cable 30, which inner conductor is connected to the outer conductor. Alternatively, the sample may be attached to the dielectric material of the cable near the inner conductor near the cable end, for example by embedding it in the cable dielectric material. The cable end is then short circuited by connecting a conductor such as a metal plate to the inner and outer conductors. This second technique is particularly advantageous when smaller cables or other cables having a fragile inner conductor are used because it permits the resonator to be made without bending the inner conductor.

The tip of the probe may be mechanically protected by applying a drop of epoxy resin. A capacitance diode 34 for tuning is connected at the other end of the cable. Tuning may be accomplished using a bias voltage (BIAS) and can be manual or automatic. As mentioned above, one method of deducing the ESR frequency of the sample is to continuously tune the resonator to always coincide with the VCO frequency by making the bias voltage a suitable function of that used to control the VCO. This is especially useful when using the frequency modulating technique.

The input and output signals to the resonator 1 are connected through a directional element 36. The direction element 36 has one port for the incoming signal (Feed), which produces an incident wave on the resonator, and one for the reflected signal, forming the output. With reference to FIG. 3, the Feed input is driven by the VCO 20 output, while the reflected output feeds the demodulator 22.

The ESR sample 2 may advantageously comprise a single crystal of TCNQ having dimensions of approximately 0.2× 0.2×0.5 mm. The coaxial cable 30 has a length of approximately 10–15 cm and a diameter of approximately 1 mm. Thus, the probe 1 is small enough to fit inside a typical biopsy needle 38, e.g. gauge 14.

During use the biopsy needle 38 may be inserted with the resonator 1 in place. The position of the needle end can thus continuously be monitored and compared to MRI images. New images can be made as needed, using the probe position for automatically placing the image slice in the correct place. Once the desired position is reached the probe 1 can be withdrawn and a surgical instrument such as a biopsy mandrel inserted in the needle for taking the biopsy sample from the desired place.

The described procedure can be facilitated further if, in addition to its position, the orientation of the biopsy needle 38 can be determined. This can be accomplished by adding a magnetic field sensor or sensors such as a coil, a Hall effect sensor or second ESR-magnetometer at a defined location on the probe 1. If a second ESR magnetometer is used, its position may be determined by electronically switching the lock unit 3 between the two sensors, or separate lock units may be used. The ESR frequency may also be determined using alternate methods, such as those discussed above. The position of the magnetic field sensor may be determined in connection with the application of known gradient sequences, for example those shown in FIG. 2. Knowing the positions of the probe 1 tip and the magnetic field sensor, the trajectory or orientation of the probe 1 may be readily determined. Other suitable methods for obtaining the orientation of the probe 1, such as gravity detectors or optical sensors or optical sensors may also be used.

Information as to the orientation of the probe 1 is particularly useful for estimating the trajectory of the needle 38 end. This trajectory may then be displayed superimposed on appropriate images of the patient. The directional information may also be used to correct the ESR positioning information. It is known that a needle-shaped metallic object will distort the magnetic field because the needle has a different susceptibility from that of tissue. This will alter the apparent position of the probe 1 and hence the biopsy needle 38. The effect depends on the angle between the needle 38 and Bo. If the orientation of the needle 38 is known, this effect can readily be corrected.

The present invention is not limited to the positioning of instruments within the anatomy of a patient, but can be used for other purposes as well. For example, the ESR probe can be built into a pointing device at a known relation to the tip of the device, preferably at or near the tip. The device can used to determine the position of fiducial points such as anatomical landmarks of a patient, for example on the skin of the patient or on a surgical frame attached to the patient. This information can be used in a variety of ways, especially in regard to manipulating images. For example, after the patient has been placed in the MR imager, the pointer can be touched to three points on or in the anatomy, hence defining a plane.

As is known in the art, an image of the patient is obtained. As is also known in the art, image slice can then be defined to pass through the three defined points, with the three selected points indicated on the image. This technique is particularly useful where it is desirable to define an image plane with regard to an organ or area of interest, such as a knee. Correlation between the defined or visible portions of the patient and the image is thereby facilitated. Such a technique is also useful for correlating MR images with images taken with different modalities, such as computed tomography (CT) or ultrasound.

The invention has been described with reference to the preferred embodiment. Obviously, modifications and alterations will occur to others upon reading an understanding the preceding description. It is intended that the invention be construed as including all such modifications an alterations insofar as they come within the scope of the appended claims or the equivalents thereof.

What claimed is:

1. A method for determining a position of a surgical instrument, the method comprising the steps of:

placing an electron spin resonance sample in a known position with respect to the surgical instrument;

placing the sample in the imaging region of a magnetic resonance imaging apparatus having a main magnetic field;

applying at least a first gradient magnetic field in the imaging region;

determining the resonant frequency of the sample in the presence of the at least a first gradient magnetic field; and based on the resonant frequency of the sample, determining the position of the surgical instrument with respect to the at least a first gradient magnetic field.

2. The method of claim 1 further comprising the steps of:

applying a second gradient magnetic field in the imaging region;

determining the resonant frequency of the sample in the presence of the second gradient magnetic field;

applying a third gradient magnetic field in the imaging region;

determining the resonant frequency of the sample in the presence of the third magnetic field; and based on the resonant frequency of sample in the presence of the first, second and third gradient magnetic fields, determining the position of the instrument in relation to the first, second, and third gradient magnetic fields.

3. The method of claim 2 wherein the first, second and third gradient magnetic fields are mutually orthogonal.

4. The method of claim 3 further comprising the steps of removing the sample from the known position with respect to the instrument; and placing a surgical device in a known position with respect to the instrument.

5. The method of claim 1 wherein determining the resonant frequency of the sample comprises the step of locking the frequency of an oscillator to the resonant frequency of the sample.

6. The method of claim 1 wherein the gradient magnetic field is a bipolar gradient and a resonant frequency data item collected during the negative gradient portion is subtracted from a resonant frequency data item collected during the corresponding positive gradient portion.

7. The method of claim 1 further comprising the step of determining the orientation of the surgical instrument.

8. The method of claim 1 further comprising the steps of obtaining a magnetic resonance image of an object in the imaging region; and displaying the position of the surgical instrument in relation to the image of the object.

9. A magnetic resonance apparatus comprising:

means for producing a homogeneous magnetic field in an imaging region;

a probe containing an electron spin resonance sample;

means for producing gradient magnetic fields in the imaging region;

means for determining the electron spin resonance frequency of the sample in the presence of at least one magnetic field gradient; and means for determining the position of the probe in relation to the at least one magnetic field gradient.

10. The apparatus of claim 9 comprising means for producing three magnetic field gradients which are mutually orthogonal and linear within the imaging region, said three magnetic field gradients being produced sequentially, the electron spin resonance frequency being determined in the presence of each of the three magnetic field gradients.

11. The apparatus of claim 9 wherein the means for determining the electron spin resonant frequency comprises an oscillator whose frequency is locked to the resonant frequency of the sample.

12. The apparatus of claim 9 further comprising a modulator which modulates the signal applied to the probe and a demodulator which demodulates the output of the probe.

13. The apparatus of claim 9 wherein the probe comprises a length of coaxial cable having an inner and an outer conductor connected together at one end of the cable to form a loop, the sample being placed in the loop.

14. The apparatus of claim 9 further comprising a magnetic field sensor mounted in a known position with respect to the probe, whereby the orientation of probe may be determined.

15. The apparatus of claim 14 wherein the magnetic field sensor is a Hall effect sensor.

16. The apparatus of claim 14 wherein the magnetic field sensor is an ESR magnetometer.

17. A device for determining a position of an instrument within the imaging region of a magnetic resonance imaging apparatus having a main magnetic field and capable of generating three orthogonal time varying gradient magnetic fields within the imaging region, the device comprising:

a probe comprising an electron spin resonance sample, the probe capable of being placed in a known position in relation to the instrument;

means for determining the resonant frequency of the sample in the presence of the gradient magnetic fields; and means for determining the position of the instrument when the sample is placed in the known position in relation to the instrument.

18. The device of claim 17 wherein the means for determining the electron spin resonant frequency comprises:

an oscillator having an output frequency and connected to an input of the probe;

a controller operatively connected to an output of the probe and to an input of the oscillator, the controller causing the output frequency of the oscillator to match the resonant frequency of the sample.

19. The device of claim 17 further comprising a magnetic field sensor mounted in a known relation to the probe.

20. The device of claim 17 further comprising a generally tubular needle having an inner diameter, wherein the probe is received within the needle.

21. The device of claim 17 wherein the probe comprises a length of coaxial cable having an inner and an outer conductor connected together at one end of the cable, the sample being placed near the connection there between.

22. The device of claim 21 wherein the coaxial cable comprises a dielectric and the sample is attached to the dielectric.

23. The device of claim 17 further including a pointing device and the probe is integral to the pointing device.

24. A method for utilizing a surgical instrument having an electron spin resonance sample placed in a known position with respect thereto, the method comprising the steps of:

placing the instrument at three locations within the imaging region of an MR imaging apparatus;

while the instrument is placed at each of the three locations, applying at least a first gradient magnetic field in the imaging region and determining the resonant frequency of the sample in the presence of the at least a first gradient magnetic field;

based on the resonant frequency of the sample at each of the three locations, determining the positions of the three locations;

acquiring MR image data indicative of an object placed within the imaging region; and based on the determined positions, producing a desired image.

25. The method of claim 24 wherein the instrument comprises a pointing device, and the step of placing the instrument includes the step of placing the pointing device in the MR imaging region.

26. The method of claim 24 comprising the step of generating an image slice of the object, which image slice includes the three locations.

27. The method of claim 24 wherein the three locations are points on an object located within the imaging region.

* * * * *